(12) United States Patent
Miura

(10) Patent No.: US 6,815,249 B2
(45) Date of Patent: Nov. 9, 2004

(54) SURFACE-MOUNT DEVICE AND METHOD FOR MANUFACTURING THE SURFACE-MOUNT DEVICE

(75) Inventor: Tsuyoshi Miura, Yamanashi-ken (JP)

(73) Assignee: Citizen Electronics Co., Ltd., Yamashi-Ken (JP)

(*) Notice: Subject to any disclaimer, the term of this patent is extended or adjusted under 35 U.S.C. 154(b) by 207 days.

(21) Appl. No.: 10/173,432

(22) Filed: Jun. 18, 2002

(65) Prior Publication Data
US 2002/0191382 A1 Dec. 19, 2002

(30) Foreign Application Priority Data
Jun. 19, 2001 (JP) .................................. 2001-184239

(51) Int. Cl.⁷ .............................................. H01L 21/44
(52) U.S. Cl. ........................................ 438/65; 438/113
(58) Field of Search ............................... 257/433, 774; 438/65, 113

(56) References Cited

U.S. PATENT DOCUMENTS 6,383,835 B1 * 5/2002 Hata et al. ..................... 438/65

* cited by examiner

*Primary Examiner*—Luan Thai
(74) *Attorney, Agent, or Firm*—Dennison, Schultz, Daugherty & MacDonald

(57) ABSTRACT

A surface-mount device has a substrate, a pair of electrodes, each of which comprises an upper electrode and a lower electrode. A pair of grooves are formed in opposite sides of the substrate. The upper electrode and the lower electrode are connected by a connecting layer formed on an inside wall of each of the grooves. An LED is mounted on one of the electrodes, and a lid is provided in an upper portion of each of the grooves. A protector layer is formed on the substrate to seal the upper electrode, LED and lids.

1 Claim, 5 Drawing Sheets

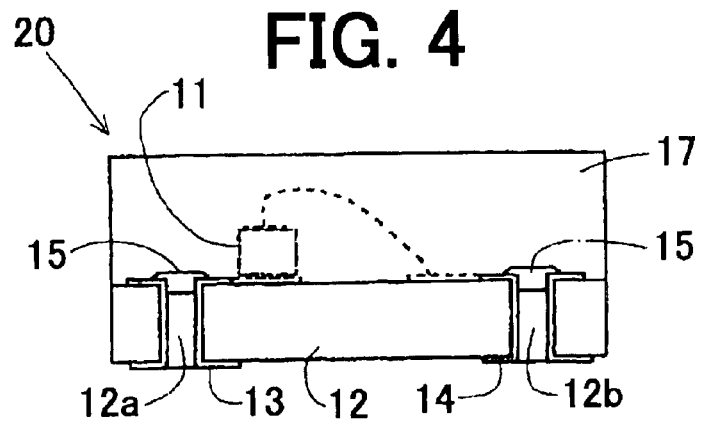
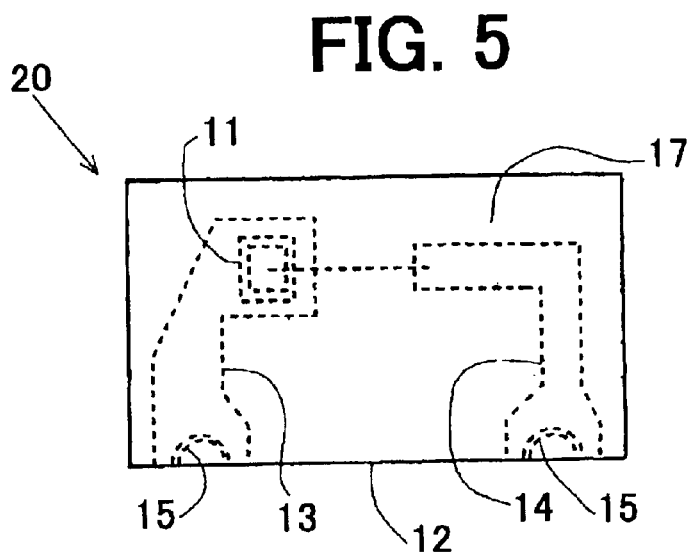
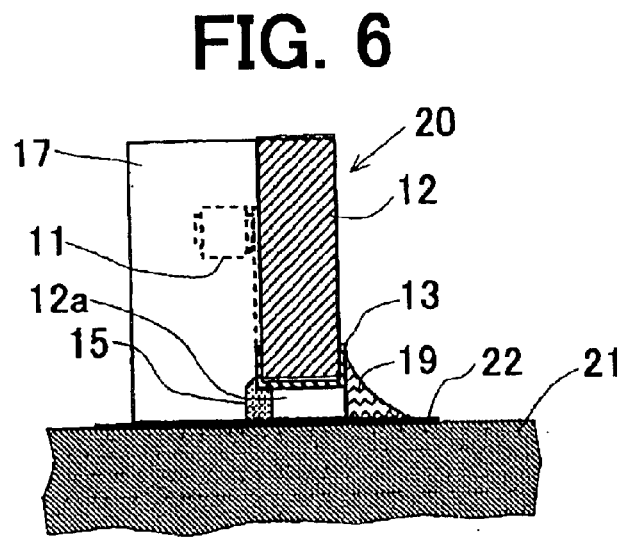

PRIOR ART  PRIOR ART  PRIOR ART  PRIOR ART

SURFACE-MOUNT DEVICE AND METHOD FOR MANUFACTURING THE SURFACE-MOUNT DEVICE

BACKGROUND OF THE INVENTION

The present invention relates to a surface-mount device and to a method for manufacturing the surface-mount device.

FIGS. 7 and 8 show a conventional light-emitting device as a surface-mount device (SMD). The light-emitting device 110 comprises an LED 101 mounted on a substrate 102 as an electronic element, electrodes 103 and 104, each formed on the upper surface, side wall, and underside of the substrate 102. The cathode 101c of the LED 101 is directly connected to the electrode 103, and the anode 101a is connected to the electrode 104 by a bonding wire 106. The LED 101, bonding wire 106 and electrodes 103 and 104 are covered by a protector layer 107. The light-emitting device 110 is manufactured together with a number of other light-emitting devices on a substrate aggregation and cutoff from the adjacent substrate 102a at an elongated through-hole 105.

On the other hand, the protector layer 107 is formed by injecting a liquid resin in a mold mounted on the substrate 102. In order to prevent the liquid resin from entering the through-hole 105, the protector layer 107 must be formed at a position away from the through-hole 105. As a result, the size of the substrate becomes large.

A light-emitting device 120 shown in FIGS. 9 and 10 dissolves the above described problem.

The light-emitting device 120 comprises an LED 121 mounted on a substrate 122, electrodes 123 and 124. The substrate 122 has a pair of grooves 122a and 122b, each having a semicircular section, at opposite sides thereof. The upper side and underside portions of the electrode 123 (124) are connected to each other by a connector portion 123a (124a) formed in the groove 122a (122b).

Each of the grooves 122a and 122b is closed by a dry film 125 at the upper opening. The whole upper surface is sealed by a protector layer 127. The dry film 125 prevents the material of the protector layer 127 from entering the groove 122a (122b).

In the light-emitting device, the electrode is not projected from the protector layer 127. Therefore, the size of the device is reduced. However if the dry film 125 does not exist, the device can be more miniaturized.

A light-emitting device 130 of FIGS. 11 and 12 is to achieve such an aim.

The light-emitting device 130 comprises an LED 131 mounted on a substrate 132, and a pair of electrodes 133 and 134. Each of the electrodes comprises an upper electrode 133a (134a) of copper foil, a lower electrode 133b (134b) of copper foil, and a connecting layer 133c (134c) formed in a groove 132a (132b). A protector layer 137 seals the LED 131 and others.

A method of forming the electrode 133 will be described hereinafter with reference to FIGS. 13a to 13d.

Referring to FIG. 13a, the upper electrode 133a and lower electrode 133b are formed on upper and lower sides of the substrate 132 with copper foil. A part of the lower electrode 133b is removed at a position corresponding to the groove 132a by etching as shown in FIG. 13b. A part of the substrate 132 is removed to form the groove 132a by laser processing as shown in FIG. 13c. Next, the connecting layer 133c is formed on the surfaces of the groove 133a, the underside of the upper electrode 133a and the underside of the lower electrode 133b as shown in FIG. 13d.

The light-emitting device 130 can be made into a small size compared with the light-emitting device 120 of FIG. 9, since the dry film is not provided. However, since the groove 132a of the device 130 is formed by the laser processing, the manufacturing cost increases.

SUMMARY OF THE INVENTION

An object of the present invention is to provide a light-emitting device which may be made into a small size at a low cost.

According to the present invention, there is provided a surface-mount device comprising a substrate, having a pair of grooves, each communicating an upper surface and a lower surface with each other, a pair of electrodes, each of which comprises an upper electrode and a lower electrode, a connecting layer formed on an inside wall of each of the grooves to electrically connect the upper electrode and the lower electrode with each other, an electronic element mounted on one of the electrodes, a lid provided in an upper portion of each of the grooves, a protector layer formed on the substrate to seal the upper electrode, electronic element and lids.

The lid is made of resist material, and the electronic element is an LED.

The grooves are formed in opposite sides of the substrate.

The present invention further provides a method for manufacturing a surface-mount device, comprising the steps of preparing a substrate aggregation having a plurality of substrate divisions, and through-holes between adjacent substrate divisions, forming a pair of electrodes, each comprising an upper electrode and a lower electrode on an upper surface and a lower surface of the substrate division, forming a connecting layer on an inside wall of through-hole for electrically connecting the upper and lower electrodes, mounting an electronic element on one of the upper electrodes, closing an upper opening of the through-hole by a lid, sealing the electronic element, the upper electrodes and lids with a protector layer, and cutting off each of the substrate divisions from the substrate aggregation at through-holes.

The lid is formed by charging a resist material in the through-hole, solidifying an upper portion of the charged resist material, and removing a non-solidified portion from the through-hole.

These and other objects and features of the present invention will become more apparent from the following detailed description with reference to the accompanying drawings.

BRIEF DESCRIPTION OF DRAWINGS

FIG. 4 is a side view of a second embodiment;

FIG. 5 is a plan view of the device;

FIG. 6 is a sectional view of the device;

DETAILED DESCRIPTION OF THE PREFERRED EMBODIMENT

Figure 1:
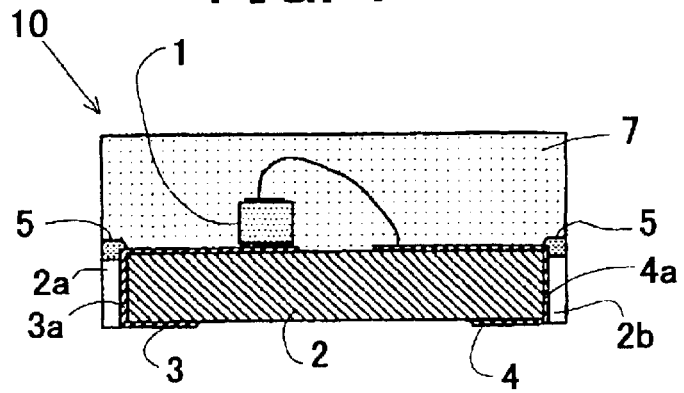
FIG. 1 is a sectional view of a surface-mount device according to a fist embodiment of the present invention.
Figure 2:
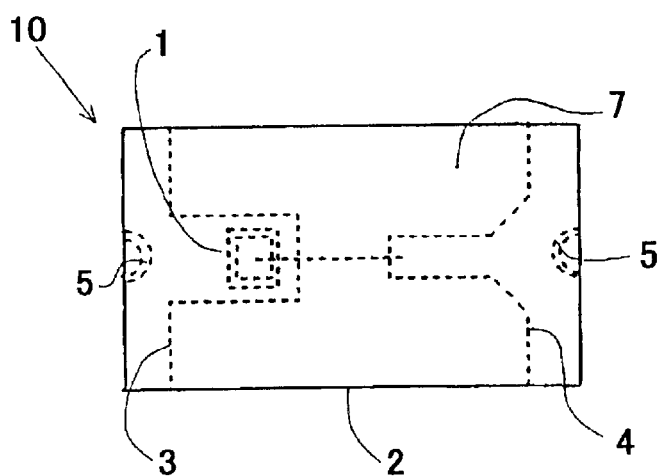
FIG. 2 is a plan view of the device.

FIG. 1 is a sectional view of a light-emitting device according to a first embodiment of the present invention, and FIG. 2 is a plan view of the device. A light-emitting device 10 is one of a pluralities of light-emitting devices which are manufactured on a substrate aggregation having a plurality of substrate divisions.

The light-emitting device 10 comprises an LED mounted on a substrate 2, electrodes 3 and 4. Each of the electrodes comprises upper electrode and a lower electrode. The substrate 2 has a pair of grooves 2a and 2b, each having a semicircular section, at opposite sides thereof. The upper and lower electrodes of the electrode 3 (4) are connected to each other by a connecting layer 3a (4a) formed in the groove 2a (2b).

Each of the grooves 2a and 2b is closed by a lid 5 of a resist material at the upper opening. The whole upper surface in sealed by a protector layer 7 with a molding process. The lid 5 prevents the material of the protector layer 7 from entering the groove 2a (2b).

A method for manufacturing the light-emitting device as the surface-mount device will be described hereinafter with reference to FIGS. 3a to 3d.

Figures 3A, 3B, 3C, 3D:
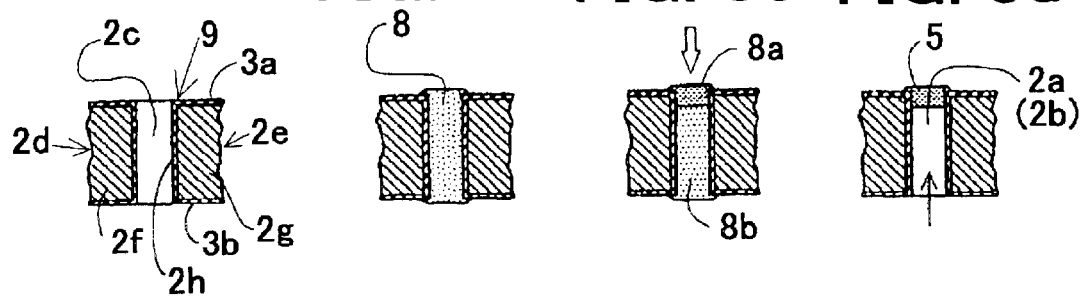
FIGS. 3a to 3d are sectional views showing a method for forming a lid in a through-hole.
Figure 7:
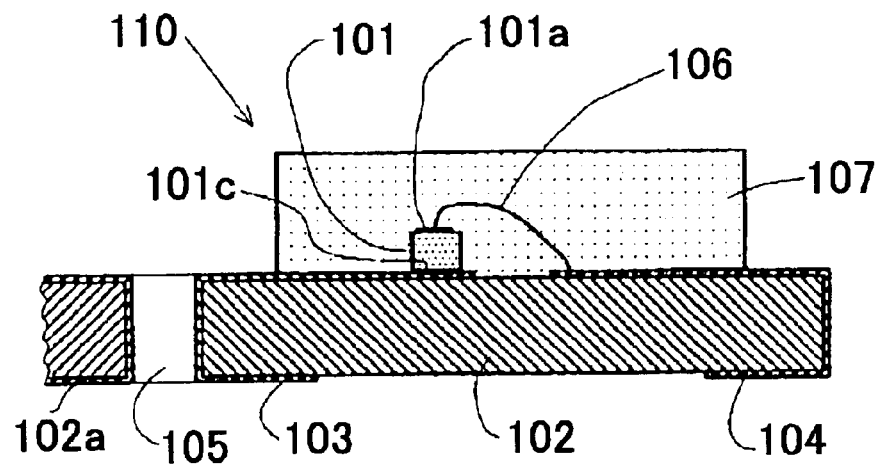
FIG. 7 is a sectional view of a conventional device.
Figure 8:
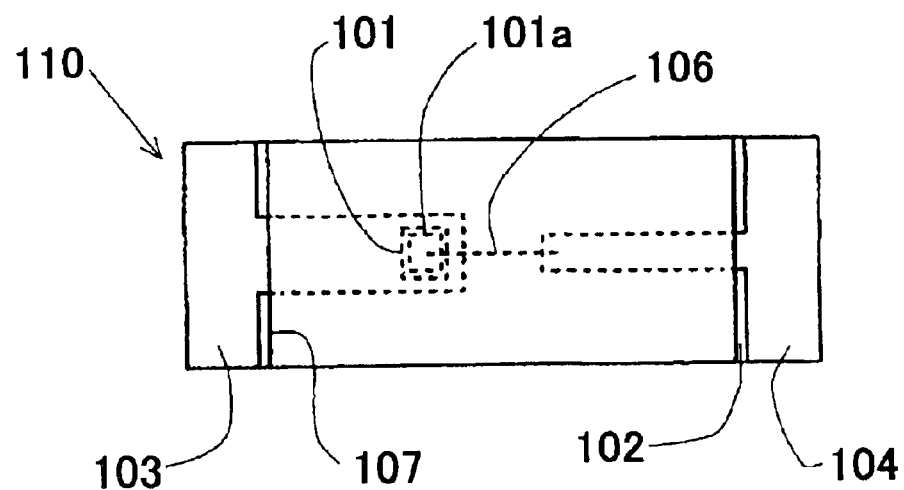
FIG. 8 is a plan view of the device.
Figure 9:
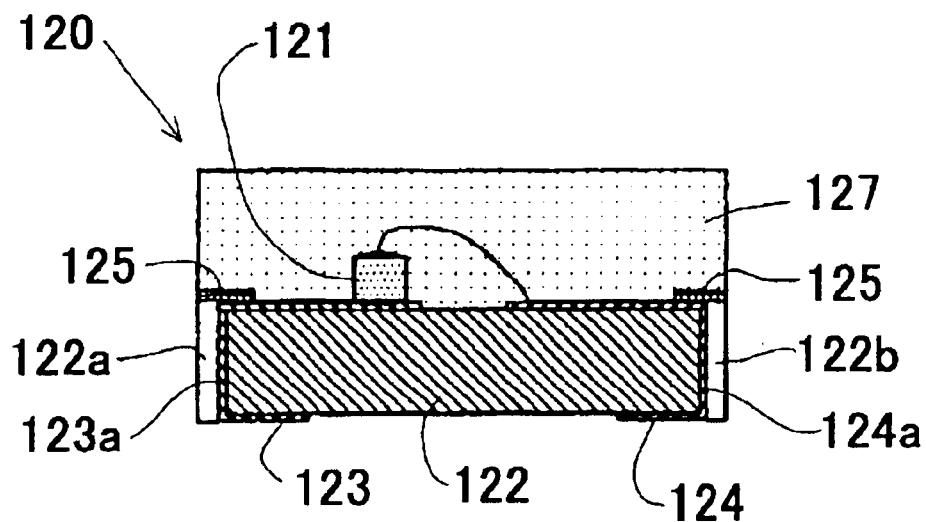
FIG. 9 is a sectional view of another conventional device.
Figure 10:
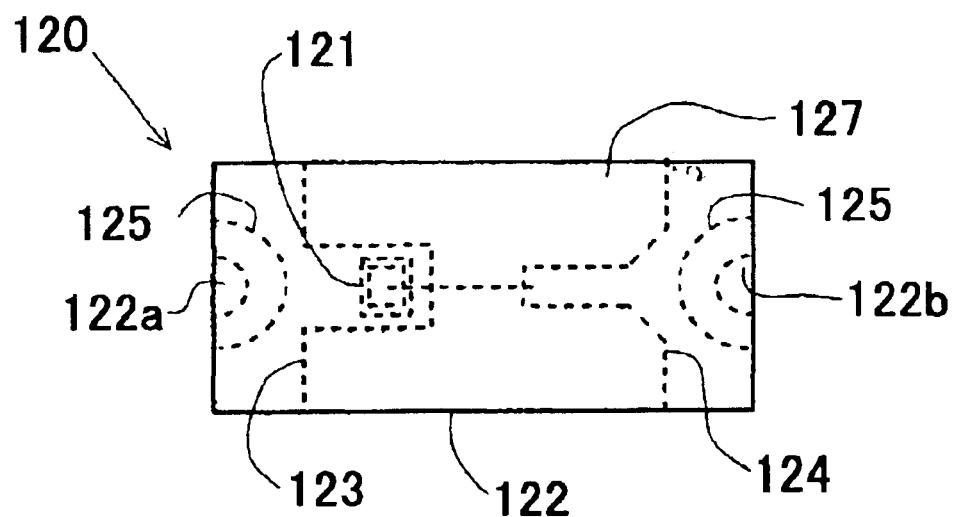
FIG. 10 is a plan view of the device.
Figure 11:
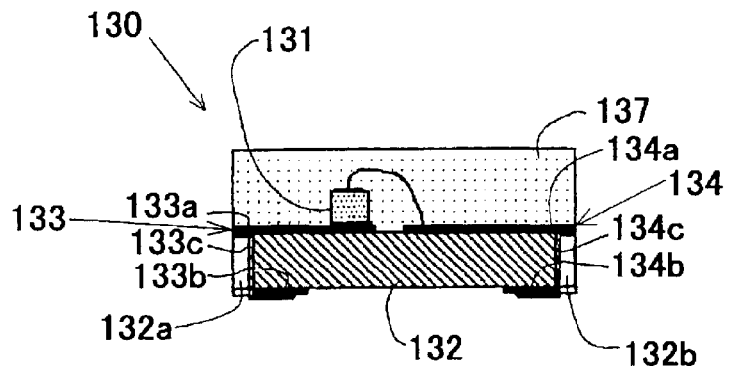
FIG. 11 is a sectional view of further another conventional device.
Figure 12:
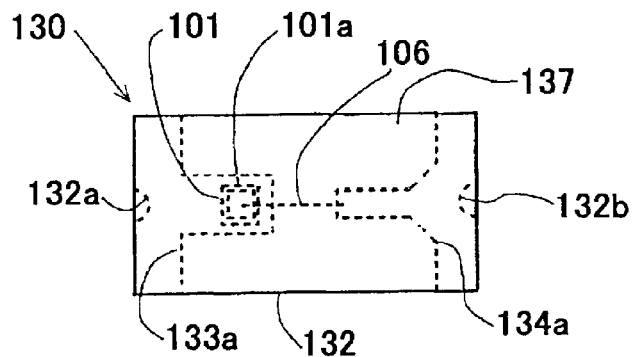
FIG. 12 is a plan view of the device.
Figures 13A, 13B, 13C, 13D:
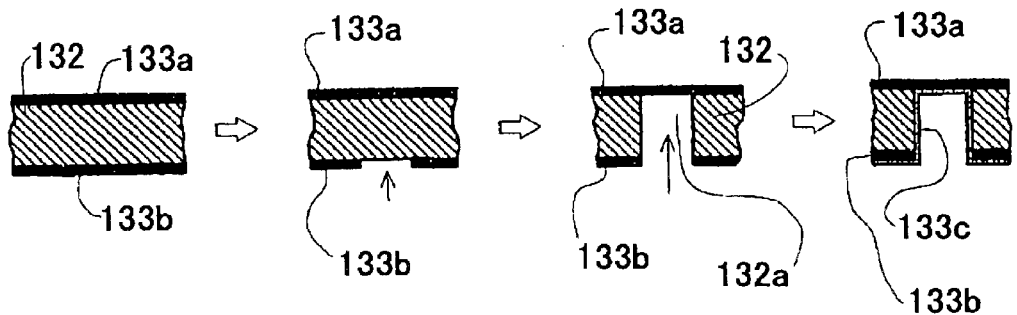
FIGS. 13a to 13d are sectional views showing a method for forming a groove.

FIG. 3a shows a part of the substrate aggregation 9 having a plurality of substrate divisions each of which is surrounded by a division line. A through-hole 2c is formed in the substrates 2f, 2g of the adjacent substrate divisions 2d and 2e at the division line by drill processing. An upper electrode 3a and a lower electrode 3b are formed by plating, and both electrodes are electrically connected by a connecting layer 2h formed on the inner wall of the through-hole 2c by plating. As shown in FIG. 3b, a liquid resist 8 is charged in the through-hole 2c. Then, the resist 8 is exposed to light so that an upper portion of the resist is solidified in a necessary depth to form a solidified portion 8a, remaining a non-solidified portion 8b as shown in FIG. 3c.

Next the non-solidified portion 8b is removed by etching as shown in FIG. 3d. After forming of the protector layer 7 (FIG. 1), the substrate divisions 2d and 2e are cut off at the division line. Thus, the device 10 of FIG. 1 is formed.

Referring to FIGS. 4 and 5 showing a second embodiment of the present invention, a pair of grooves 12a and 12b are formed in a long side of a rectangular substrate 12. Electrodes 13, 14 and lids 15 are formed in the same manner as the first embodiment. On the electrode 13, an LED 11 is mounted, and a protector layer 17 is formed on the upper surface of the substrate 12 to provide a light-emitting device 20.

Referring to FIG. 6, the light-emitting device 20 is mounted on a circuit pattern 22 of a mother board 21 at the long side having through-holes 12a, and the electrodes 13, 14 are connected to the circuit pattern 22 by a solder 19.

In accordance with the present invention, the lid is formed in the groove. Therefore, the surface area of the lid is small compared with the device of FIG. 1, so that the size of the device can be reduced. Furthermore, since the device is manufactured without laser processing, the device can be made at a low cost.

While the invention has been described in conjunction with preferred specific embodiment thereof, it will be understood that this description is intended to illustrate and not limit the scope of the invention, which is defined by the following claims.

What is claimed is:

1. A method for manufacturing a surface-mount device, comprising the steps of:

preparing a substrate aggregation having a plurality of substrate divisions, and through-holes between adjacent substrate divisions;

forming a pair of electrodes, each comprising an upper electrode and a lower electrode on an upper surface and a lower surface of the substrate division;

forming a connecting layer on an inside wall of through-hole for electrically connecting the upper and lower electrodes;

mounting an electronic element on one of the upper electrodes; closing an upper opening of the through-hole by a lid;

sealing the electronic element, the upper electrodes and lids with a protector layer; and cutting off each of the substrate divisions from the substrate aggregation at through-holes, wherein the lid is formed by charging a resist material in the through-hole, solidifying an upper portion of the charged resist material, and removing a non-solidified portion from the through-hole.

* * * * *